United States Patent [19]
Brunda

[11] Patent Number: 5,350,999
[45] Date of Patent: Sep. 27, 1994

[54] MEASUREMENT SYSTEM AND METHOD FOR DETERMINING THE AMOUNT OF ELECTROMAGNETIC RADIATION ENERGY BEING ABSORBED BY LIVING BEINGS

[76] Inventor: Daniel D. Brunda, 106 W. Upper Ferry, W. Trenton, N.J. 08628

[21] Appl. No.: 137,983

[22] Filed: Oct. 19, 1993

Related U.S. Application Data

[63] Continuation of Ser. No. 858,626, Mar. 27, 1992, abandoned.

[51] Int. Cl.$^5$ ............................................. G01R 31/02
[52] U.S. Cl. ..................................... 324/72; 324/457
[58] Field of Search ................... 324/72, 457; 361/212; 307/326; 340/660

[56] References Cited

U.S. PATENT DOCUMENTS

| | | | |
|---|---|---|---|
| 3,555,529 | 1/1971 | Brown et al. | 324/133 |
| 3,921,071 | 11/1975 | Janoski | 324/95 |
| 4,088,950 | 5/1978 | Kirby | 324/95 |
| 4,277,745 | 7/1981 | Deno | 324/457 |
| 4,714,915 | 12/1987 | Hascal et al. | 324/457 |
| 4,804,922 | 2/1989 | Sometani et al. | 324/72 |
| 4,983,954 | 1/1991 | Huston | 324/457 |

*Primary Examiner*—Maura K. Regan
*Attorney, Agent, or Firm*—Sachs & Sachs

[57] ABSTRACT

A measurement system and method for determining the amount of radiation absorbed by living beings includes a measurement device capable of measuring the amount of radiation emanating from power lines and any other source of radiation of electromagnetic energy (non-ionizing) at a particular location and electrically conductive contact devices for connecting the measurement device to a living being and to a ground and requires that a reference reading be taken and then a second reading obtained by connecting the measurement device to an appendage on a living being with the other end of the meter being connected to ground, a subtraction device indicates the amount of radiation being absorbed by the living being.

4 Claims, 2 Drawing Sheets

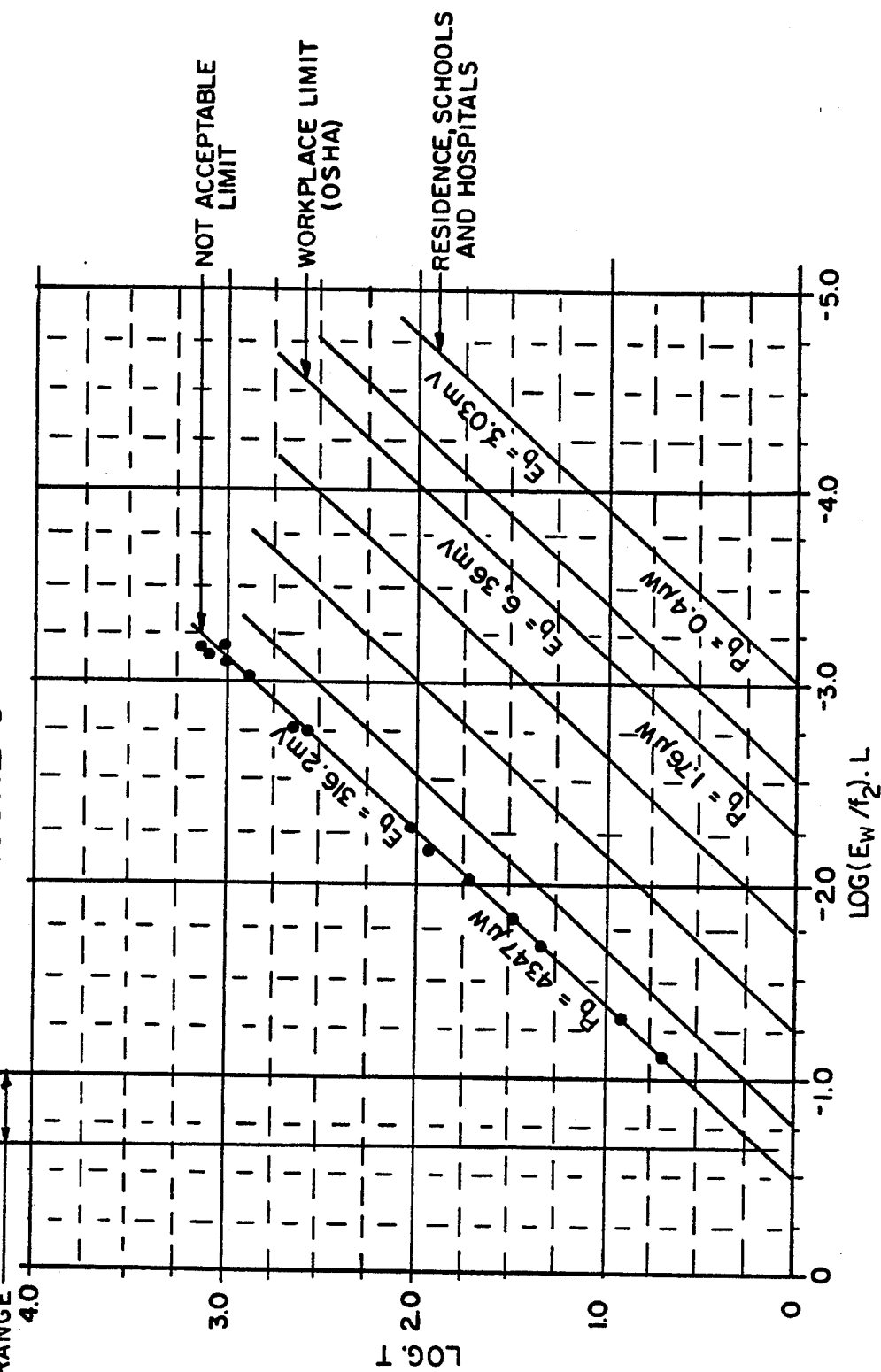

MEASUREMENT SYSTEM AND METHOD FOR DETERMINING THE AMOUNT OF ELECTROMAGNETIC RADIATION ENERGY BEING ABSORBED BY LIVING BEINGS

This application is a continuation of U.S. patent application Ser. No. 07/858,626, filed Mar. 27, 1992, by the applicant, Daniel D. Brundra, now abandoned.

BACKGROUND OF THE INVENTION

1. Field of the Invention

The present invention relates to the measurement of electromagnetic (non-ionic) radiation emanating from power lines and, more particularly, relates to the measurement of the electromagnetic waves being absorbed by human beings proximate overhead power lines and/or electronic equipment utilizing electrical energy.

2. Discussion of the Relevant Art

The art abounds with measurement devices suitable for measuring electromagnetic waves and radiated electromagnetic energy in the low frequency (60 Hz), high frequency, very high frequency, etc. ranges throughout the spectrum, including light waves.

There have been numerous studies made on the effect of these radiated (non-ionizing) waves on living beings to determine what effect, if any they may cause. Several studies have been made to evaluate the effects on living beings and various results have been obtained both favorable and non-favorable.

The present invention is concerned with low frequency radiation, in particular, 60 Hz, which radiates from high voltage power transmission lines, as well as, electronic equipment using the standard 110 and 220 volts, 60 Hz power. In an industrial and/or office environment where lighting is present, as well as, computers and other electronic media it would be advantageous to be able to measure the amount of radiation present in a particular location, where the living being may be living and working, and to measure the radiation absorbed by a human being.

This invention provides a means for making relative measurements of the environment so that studies may be made hereafter to determine the effect of the electromagnetic waves upon living beings placed in an environment where electromagnetic radiation is present. There is no attempt in this invention to evaluate the effects of the radiation upon living beings, but rather to provide an apparatus and method for taking measurements at a particular location, which then can be compared with measurements taken in an environment that is free of the electromagnetic radiation so that studies thereon will be able to determine the effect of various levels of radiation.

Therefore, it is an object of the present invention to provide a system for determining the amount of radiation absorbed by living beings at a particular location.

It is another object of the present invention to provide a measurement system for determining the amount of electromagnetic radiation at a particular location.

It is yet another object of the present invention to provide a relatively simple apparatus and method for taking these measurements.

It is still yet another object of the present invention to provide a method for obtaining the amount of electromagnetic radiation absorbed by a living being at a particular location.

SUMMARY OF THE INVENTION

A measurement system for determining the amount of radiation absorbed by living beings, according to the principles of the present invention, includes a measurement device for measuring the amount of radiation emanating from power lines and any other source of radiation of electromagnetic energy at a particular location, a grounding device for obtaining an adequate electrical ground connection, and a measurement device having a ground terminal and a measurement terminal to measure the electromagnetic energy. A first electrical conducting device is connected between the grounding device and the ground terminal of the measurement device. An electrical contact device makes electrical conductive contact with a living being and a second electrical conducting device connected between the electrical contact device and the measurement terminal of the measurement device. The measurement device includes a subtracting device for providing a reading of the difference of the two measurements.

The method of obtaining the measurement of the amount of electromagnetic radiation absorbed by a living being at a particular location, according to the principles of the present invention, includes the steps of (a) obtaining a measurement of the amount of electromagnetic radiation occurring at the particular location; (b) obtaining a measurement of the amount of electromagnetic radiation occurring when the living being is disposed at the particular location and connected to a measurement device; and subtracting the reading obtained in step (a) from the reading obtained in step (b).

The foregoing and other objects and advantages will appear from the description to follow. In the description reference is made to the accompanying drawing, which forms a part hereof, and in which is shown by way of illustration a specific embodiment in which the invention may be practiced. This embodiment will be described in sufficient detail to enable those skilled in the art to practice the invention and it is to be understood that other embodiments may be utilized and that structural changes may be made without departing from the scope of the invention. The following detailed description is, therefore, not to be taken in a limiting sense, and the scope of the present invention is best defined by the appended claims.

DESCRIPTION OF THE DRAWING

In order that the invention may be more fully understood, it will now be described, by way of example, with reference to the accompanying drawing in which:

FIG. 3 is a graph showing the effects of radiated power absorbed by the living being and the levels in which cancer rates are increased relative to the amount of absorbed power by a living being.

DESCRIPTION OF THE PREFERRED EMBODIMENT

A low frequency (60 Hz) alternating current transmission system, supplying power to industrial environments, homes, etc. for utilization by different types of equipment, as is well known, radiates electromagnetic fields. The power lines, as well as, the electronic equipment utilizing this energy are continuously radiating non-ionizing electromagnetic waves that may be absorbed by living beings in close proximity thereto. Many papers have been written with regard to the effect on living beings (the human body) affected by exposure to these radiated waves. What the inventor has attempted to do herein is to provide a simple system and method for obtaining measurements of these absorbed electromagnetic waves so that the relative information obtained will be useful in future studies. The earlier studies made on the effects of electromagnetic radiation such as for example the study entitled: "CASE-CONTROL STUDY OF CHILDHOOD CANCER AND EXPOSURE TO 60-Hz MAGNETIC FIELDS", made by Doctor David A. Savitz, Howard Wachtel, Frank A. Barnes, Esther M. John and Jiri G. Tvrdik published in the American Journal of Epidemiology, copyright 1988 by The Johns Hopkins University School of Hygiene and Public Health (which is incorporated herein in its entirety), did not measure the radiation absorbed by human beings. However, correlation between different studies may be readily made with ease, since a simple method and apparatus is now available to obtain the measurements.

Figure 1:
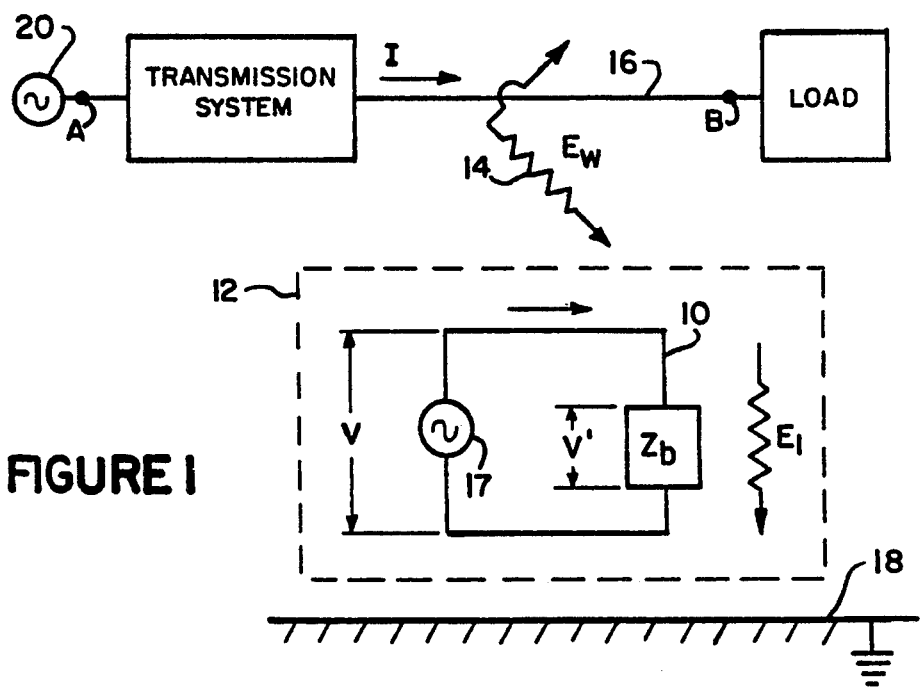
FIG. 1 is a pictorial schematic representation of electromagnetic radiation emanating from overhead power transmission lines and electronic equipment impinging upon a biological equivalent circuit of a living being, according to the principles of the present invention.

Referring now to FIG. 1, which shows a pictorial schematic representation of inductive coupling of a biological circuit 10 of a human body 12, illustrated in block form, from an external electromagnetic field ($E_w$) 14 produced by an overhead power transmission line 16. The reactive impedance of the body 12 may be represented by $Z_b$. The body power source 17 represented by the symbol V causes a current i to flow in the circuit for the body 10.

When the body 12 is introduced into the field 14 by appearing beneath power line 16, the body 12 experiences an increased electric current flow i'. Inside the body 12, there takes place a voltage drop V' to which there corresponds an internal electric field 18 ($E_i$) that is generally different from the external electric field $E_w$ associated with the field 14. The body's surface causes a distortion of the external electromagnetic field 14 with considerable local variations that depend on the curvature radii of the various parts of the living being 10 and on its dielectric characteristics.

Human beings are sensitive to the electromagnetic field 14 primarily because of the low inductive body impedance, especially in the cranium or head. Conducting objects placed in the electromagnetic field 14 can modify and enhance the field. The magnitude of the enhancing effect depends on the shape and orientation of the conducting object.

For the human body 10 not in contact with ground 18, the electromagnetic field 14 is enhanced immediately about the head to 15 to 20 times that of the undisturbed field. Approximately one-third of the body current i' enters the head. Low bodily impedance $Z_b$ permits the electromagnetic field 14 to induce electrical current i' in the head and the entire body, the current i' being conducted throughout the body by the blood.

The human brain operates at frequencies ranging from 1 Hz to 300 Hz with high concentrations of electromagnetic radiation at 1 Hz to 51 Hz. The electromagnetic field 14 when at a relatively low frequency is absorbed by the electrical circuits of the brain, the heart and the nervous system of the body 12 and by virtue of the resonant circuits found therein generates circulating currents much greater than the non-resonant parts of the human body 12. This current i' caused by the inductive coupling causes the normal electrical control currents of the body (i) to be supplemented (increased) to i+i' by electromagnetic radiation resulting in the heart rate and blood pressure being disturbed by the added current (i').

To define an inductive coupling model for the human body 12 subjected to an electromagnetic field 14 calls for an initial approximation. The presence of a biological equivalent circuit 10 of the human body 12 occurs by an analogy. The electromagnetic field 14 is capable of inducing a current in wires and cables of nearby electrical systems, regardless of the nature of the source or the type of conductor. In the biological equivalent circuit 10 of the human body 12, blood vessels serve as electric conductor paths (cables), blood serves as one segment of the electrical conductor in the circuit 10, and interstitial fluid, i.e., the fluid between the cells of tissue, serve as another. Since all tissues are irrigated by blood and interstitial fluid, the entire body can be considered as being made up of predominantly essentially homogeneous conducting material.

According to this equivalent model, electrical current (i') is induced in the human body 12 by the intersecting, alternating electric and magnetic fields formed by the radiated electromagnetic field 14 generated by the current I flowing through the power line 16.

The outer membrane cells have a sufficiently high resistance so that almost all of the current flows around these cells. However, the blood conducting cells and membrane are controlled in part by electric current flow and thus are the sites of a number of physiological processes which are important to cell function.

The power $P_b$ induced in the head of the body 12 can be determined by $P_b = (T^2/Z_b)(24.1/ME)^2 (E_c/P_c)^2$, wherein ME is a cell or membrane excitation parameter, $Z_b$ is the bodily impedance, T is the transfer function, $E_c$ is the powerline voltage and $P_c$ is the powerline transmitted power.

The method of transferring the power $P_b$ from the power lines to the head involves treating the body 12 as having an inductive impedance ($Z_b$) equal to 23 ohms and disposed parallel to the transmission line 16. For example, the transfer of radiated electrical power from the power line 16 to the "parallel" body 12 having blood vessels, etc. therein, assumed to be the same as the transfer of electromagnetic energy from one power transmission line to an adjacent parallel transmission line, not shown.

In the electrical equivalent circuit model for power transmission and coupling therein, the natural frequency of approximately one Hertz the human body's biological equivalent circuit is referred to as $f_2$. If we assume that this is the natural biological frequency for the human body 12, Then acceptable or preferred radiation level for human beings occurs when:

$0 < H_\phi < 10$ uG $0 < f_2 < 1$ Hz

Inductive power coupling transfer function (T) for parallel conductors may be calculated as follows:

$(I_b)_{ind} = E_w/f + 20 \log (I_c/E_w)$
$(I_c E_w) = E_c Z_b / 12{,}600 ME$

-continued $(I_c E_w) = 24.1/ME = 13,200V(23 \text{ ohms})/12,600ME (\mu w/M)$
$I_c = (24.1/ME) [1/(E_w/f_2)] = E_c/Z_c$
$E_c = (24.1/ME) (Z_c/E_w/f_2)$
$P_b = E_b^2/Z_b = (24.1/ME)^2 (E_c/P_c)^2 (T^2/z_b);$
where $T = E_b/(E_w/f_2)L$ From actual measurements the following was obtained:

$\text{Log } P_b = 2 \text{ Log } T + 2 \text{ Log } (E_w/f_2) - \text{ Log } Z_b$
$\text{Log } T = 0.5 - [\text{Log } (E_w/f_2) + 1.0]$
$\text{Log } T + \text{ Log } (E_w/f_2) = -0.5$
$T = E_b/(E_w/f_2)L$
Therefore; $E_b = 316.2$ mv
And $P_b = 4347 \mu w$, which is not an acceptable level.

The calculations shown above show that an unshielded 13.2 kv power line at 30 meters provides a radiated power which is not acceptable.

An attempt to determine the maximum acceptable power line voltage (5000 volts) to obtain the acceptable radiation absorption level at 30 meters is shown below:

$(I_c E_w)$ at $5kv = 5000(23)/12,600 = 9.13/ME (\mu W/m)$
and $(P_b)$ at a maximum of $5kv = (9.13/ME)^2 \cdot (E_c/P_c)^2 (T^2/Z_b)$
$(P_b)_{max} = 43.47$ microwatts for $E_c = 5000$ volts at 30 meters.

Therefore, it is advisable to obtain readings of the electromagnetic radiation occurring at a particular location where living beings are to be present.

Figure 2:
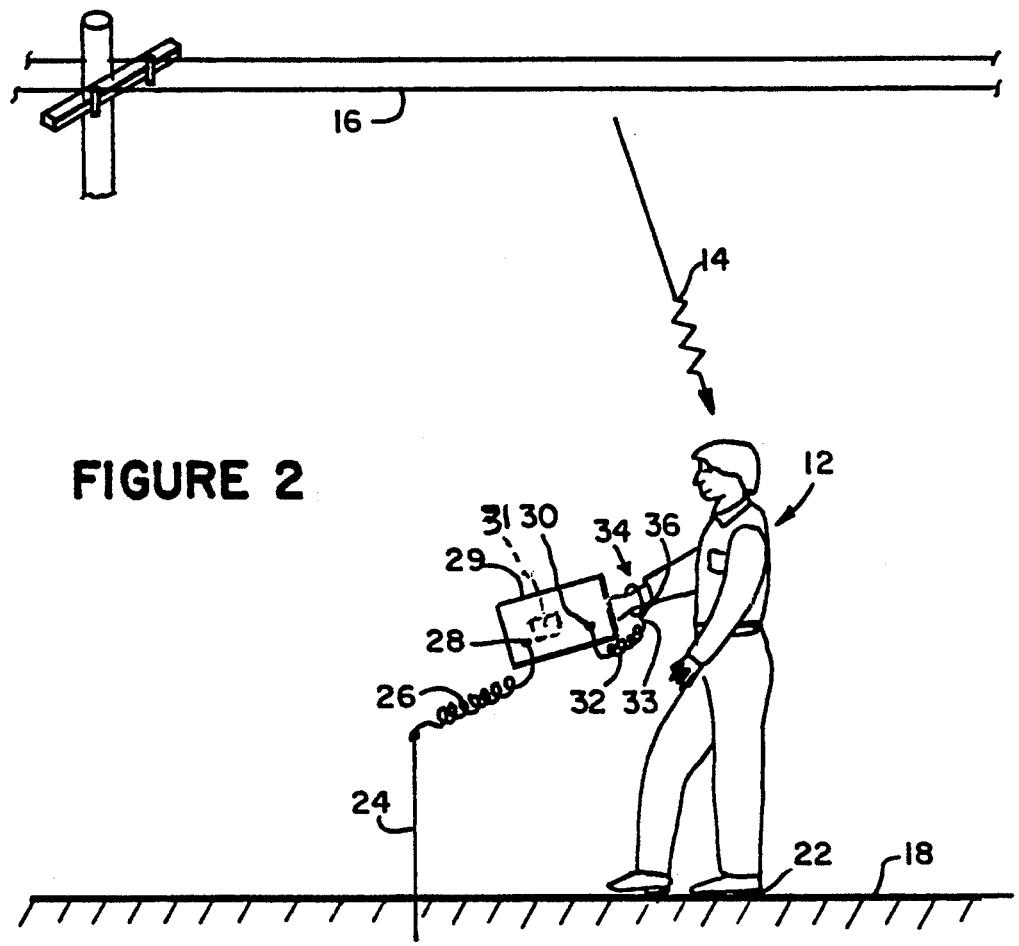
FIG. 2 is a pictorial representation of a living being showing the method of obtaining the measurements required.

Referring now to FIG. 2 which shows a human being 12 absorbing radiation from a power line 16 appearing overhead by means of the radiated energy 22 given by the equation:

$$P_b = E_b^2/Z_b$$

entering the body of the human being 12. If the living being (human 12) is effectively above a common ground 18 by some insulated material 22 e.g. non-conducting rubber shoes, carpeting, etc., etc., then the human being is absorbing the radiated electromagnetic energy.

By utilizing an effective ground 24, which may be a ground rod set in the earth or the ground connection of a three pronged electrical socket, which eventually gets to the earth 18 we have a ground reference. Utilizing an electrically conductive path (wire) 26 that is connected to the ground terminal 28 of a true RMS reading meter 29, such as Fluke Model 87 manufactured by the Fluke Corporation of Everett, Wash. and preferably includes a subtracting device 31 disposed within the meter 29.

The measurement terminal 30 of meter 29 is connected by means of an electrically conducting wire 32 to a wrist strap 34, which is adjustable and includes a receptacle 36 thereon adapted to receive the wire 32 therein, via a plug 33. The wrist strap or band 34 and receptacle 36 is of the type manufactured by DESCO Industries, Inc., of Walnut, Calif. as Model No. 9081A which is placed on an appendage of the living being 12.

Initially a reading is taken by the meter 29 with the wrist strap left suspended in air or lying on an object nearby so that a zero reference reading may be obtained. The cuff is then placed upon an appendage of the living being and a second reading in millivolts is taken. The first reading is subtracted from the second reading by the subtraction device 31, located preferably within the meter 29, yielding the amount of radiated electromagnetic voltage ($E_b$) available to be absorbed or being absorbed by the human being 12. Measurements as described above taken at different locations at different proximities from the power lines will indicate the relative amount of electromagnetic energy being absorbed by the human being 12. If a ground rod 24 is not available an ESD grounding plug manufactured by the Ideal Industries, Inc., of Sycamore, Ill. as Model No. 61038, may be used for indoor ground circuits instead of an outside grounding rod.

Referring now to FIG. 3, which shows a plot of the log T on the vertical axis and the log $(E_w/F_2) \times L$ on the horizontal axis $T = $ Transfer Function $= E_b(mv)/(E_w/f_2)L$ (mv/M)
$\text{Log } T = 0.5 - [\text{LOG}(E_w/f_2) + 1.0]$, and
$P_b = $ Bodily Induced Power ($\mu W$) is given by;
$P_b = (E_b^2/Z_b)$
$P_b = (T^2/Z_b) (24.1/ME)^2 (E_c/P_c)^2$
where $E_c = 13.2KV$, and $f_1 = 60$ Hz, and
$r_m = 40$ Meters
$L = 1$ Meter
$E_b = $ Bodily Induced Voltage
$E_w = $ Electric Field Strength
$f = $ Frequency of Electric Field If the information as obtained by Doctor D. A. Savitz, et al in the report referred to above is inserted onto the graph of FIG. 3 one could see that the cancer deaths associated with the exposure to the electromagnetic radiation occurs when the Log $(E_w/f_2)$ L is less than $-1.0$ and the Log of T exceeds 0.25. It further follows that the risk of cancer increases when the $P_b > 1.76 \mu W$ and $E_b > 6.36$ mV in the work place. For residences, schools and hospitals, where people are exposed to powerline radiation for 168 hours per week, the cancer power limit is 0.40 $\mu W$ and 3.03 mV. Below these power levels, there is no correlation, with the occurrence of cancer and the absorption of electromagnetic radiation.

For further information with regard to the amount of energy being absorbed by a human being reference may be had to co-pending application, (Ser. No. 07/753,,857, filed on Sep. 3, 1991, by Donald F. Brunda) now abandoned.

In operation, the system is utilized by connecting the ground connection 24 or alternatively the internal grounding plug into the electrical socket and the Fluke multimeter 29 is connected to the grounding terminal in a conventional manner. The measuring terminal of the meter 29 is connected to the wrist strap 34 means of wire 32, which has a plug thereon 33 adapted to be received into the socket 36 provided on cuff 34. The cuff 34 permitted to rest upon an object, not shown, or ground at the area where the measurement is to be taken and the reading in millivolts is stored in the subtracting device 31. A second reading is taken by placing the cuff 34 on an appendage of the living being subtracting the reference reading (the first reading) from the second reading, by the subtraction device 31 placed within the meter 29 the amount of voltage being absorbed by the living being is determined. This data then may be used for comparison purposes. The living being may be moved to various places at different distances from the source of electrical energy or the amount of energy being used can be decreased by turning off or reducing lighting and/or other equipment to decrease the amount of radiation being absorbed. The amount of this reading can then be correlated with the statistical data obtained by Doctor Savitz, et al, referred to above.

Hereinbefore, has been disclosed a simple measurement system and method for determining the amount of electromagnetic radiation being absorbed by living beings, which should be useful to those trying to obtain correlation with the amount of electromagnetic radiation absorbed and the number of cancer rates occurring due to the increased strength and the proximity to high powered radiation emanating from power transmission lines. It will be understood that various changes in the details, materials, arrangement of parts and operating conditions which have been herein described and illustrated in order to explain the nature of the invention may be made by those skilled in the art within the principles and scope of the instant invention.

Having thus set forth the nature of the invention, what is claimed is:

1. A measurement system for determining the amount of radiation absorbed by living beings comprises:
    a) measurement means for measuring the amount of radiation emanating from power lines and any other source of radiation of electromagnetic energy at a particular location, said measurement means including;
        i) grounding means for obtaining an adequate electrical ground connection,
        ii) a meter having a ground terminal and a measurement terminal for measuring electromagnetic energy,
    b) a first electrical conductor connected between said grounding means and said ground terminal of said measurement meter;
    c) an electrically conducting expandable cuff adapted to be affixed on an appendage of said living beings for making electrically conductive contact with said living beings;
    d) a second electrical conductor connected between said expandable cuff and said measurement terminal of said meter; and
    e) subtracting means connected to said measurement terminal of said meter for subtracting the value obtained when said electrically conductive expandable cuff is not making contact with said living being from the value obtained when electrically conducting expandable cuff is making electrically conductive contact with said living being;
    thereby yielding the amount of radiation being absorbed by said living beings.

2. A measurement system for determining the amount of radiation absorbed by living beings according to claim 1, wherein said measurement meter means includes means for measuring low frequency true RMS millivolts.

3. The method of obtaining a measurement of the amount of electromagnetic radiation absorbed by a living being at a particular location comprising the steps of:
    a) providing an adequate electrical ground connection;
    b) connecting first electrical conducting means between said ground terminal of a measurement meter means;
    c) obtaining a first measurement of electromagnetic energy by said measurement meter means at a measurement terminal of said meter;
    d) making electrical conductive contact with said living being with electrical contact means;
    e) connecting second electrical conducting means between said electrical contact means and said measurement terminal of said measurement meter means;
    f) obtaining a second measurement of electromagnetic energy at said measurement terminal of said measurement meter means and
    g) determining the amount of radiation absorbed by said living being by subtracting the reading in c) from that in f).

4. The method of obtaining a measurement of the amount of electromagnetic radiation absorbed by a living being at a particular location comprising the steps of:
    a) measuring the amount of electromagnetic radiation occurring at said particular location by using a measuring device which includes;
        i) grounding means for obtaining an adequate electrical ground connection,
        ii) a meter having a ground terminal and a measurement terminal for measuring electromagnetic energy,
        iii) a first electrical conductor connected between said grounding means and said ground terminal of said measurement meter,
        iv) an electrically conductive expandable cuff for making electrically conductive contact with said living being, and
        v) a second electrical conductor connected between said electrically conductive expandable cuff and said measurement terminal of said measurement meter;
    b) measuring the electromagnetic radiation occurring when said living being is at said particular location and connected by said electrically conductive expandable cuff to said meter measurement terminal; and
    c) subtracting the reading obtained in step a) from the reading obtained in step b), obtaining from said subtraction a quantity indicative of the electromagnetic energy absorbed by said living being at a particular location.

* * * * *